US008746310B2

(12) United States Patent
Wason et al.

(10) Patent No.: US 8,746,310 B2
(45) Date of Patent: Jun. 10, 2014

(54) SYSTEM AND METHOD FOR PROBE-BASED HIGH PRECISION SPATIAL ORIENTATION CONTROL AND ASSEMBLY OF PARTS FOR MICROASSEMBLY USING COMPUTER VISION

(75) Inventors: John Wason, Troy, NY (US); John T. Wen, Melrose, NY (US); Jason Gorman, Silver Spring, MD (US); Nicholas Dagalakis, Potomac, MD (US)

(73) Assignee: The United States of America, as represented by the Secretary of Commerce, The National Instutute of Standards and Technology, Washington, DC (US)

( * ) Notice: Subject to any disclaimer, the term of this patent is extended or adjusted under 35 U.S.C. 154(b) by 102 days.

(21) Appl. No.: 13/469,479

(22) Filed: May 11, 2012

(65) Prior Publication Data

US 2012/0304786 A1 Dec. 6, 2012

Related U.S. Application Data

(60) Provisional application No. 61/519,851, filed on May 31, 2011.

(51) Int. Cl.
| | |
|---|---|
| *B32B 41/00* | (2006.01) |
| *B29C 65/52* | (2006.01) |
| *B29C 65/56* | (2006.01) |
| *B32B 37/00* | (2006.01) |
| *B32B 38/00* | (2006.01) |

(52) U.S. Cl.
USPC ........... 156/378; 156/356; 156/391; 438/106; 438/118

(58) Field of Classification Search
USPC .......... 156/356, 378, 391, 588; 438/106, 118, 438/406, 455
See application file for complete search history.

(56) References Cited

U.S. PATENT DOCUMENTS

| | | | | |
|---|---|---|---|---|
| 6,798,120 | B1 | 9/2004 | Fearing et al. | |
| 7,267,150 | B2 * | 9/2007 | Shimizu et al. | 156/378 |
| 7,446,423 | B2 * | 11/2008 | Sakai et al. | 257/783 |
| 7,678,211 | B2 * | 3/2010 | Takasaki et al. | 156/64 |
| 7,896,047 | B2 * | 3/2011 | Yamamoto | 156/378 |
| 7,988,803 | B2 * | 8/2011 | Takasaki et al. | 156/64 |
| 8,091,764 | B2 * | 1/2012 | Suga et al. | 228/180.21 |
| 2006/0264086 | A1 | 11/2006 | Nolan | |
| 2008/0093424 | A1 * | 4/2008 | Kumar et al. | 228/245 |
| 2011/0299969 | A1 | 12/2011 | Sun et al. | |

OTHER PUBLICATIONS

Ferreira, A, "Automatic Microassembly System Assisted by Vision Servoing and Virtual Reality," IEEE/ASME Transactions on Mechatronios (2004) 9(2):321-333, June.
Wason, J. D., "Visually-Guided Multi-Probe Microassembly of Spatial Microelectromechanical Systems," Ph.D. dissertation, Rensselaer Polytechnic Institute, Troy, NY, 2011, 203 pages.

* cited by examiner

*Primary Examiner* — Sonya Mazumdar
(74) *Attorney, Agent, or Firm* — Kermit D. Lopez; Luis M. Ortiz; Ortiz & Lopez, PLLC

(57) ABSTRACT

A microassembly method and system utilizing multiple probes. Multiple manipulation actuators can be utilized for maintaining/holding one or more probes and an assembly substrate. Multiple microscope cameras can be configured to provide three distinct workspace configurations. At the center of each manipulation actuator is a die stage, which supports the assembly substrate upon which parts are assembled. A glue dispenser can also provide glue to a part prior to placement.

15 Claims, 3 Drawing Sheets

SYSTEM AND METHOD FOR PROBE-BASED HIGH PRECISION SPATIAL ORIENTATION CONTROL AND ASSEMBLY OF PARTS FOR MICROASSEMBLY USING COMPUTER VISION

CROSS-REFERENCE TO PROVISIONAL APPLICATION

The present application claims benefit of priority under 35 U.S.C. 119(e) of U.S. Provisional Patent Application Ser. No. 61/519,851, filed on May 31, 2011, which is incorporated herein by reference in its entirety.

TECHNICAL FIELD

Embodiments are further related to multi-probe microassembly. Embodiments are also related to a method of multi-probe microassembly using computer vision.

BACKGROUND OF THE INVENTION

As microelectromechanical systems (MEMS) become functionally more complex, the need for assembly devices and methods that can accomplish more complex structures is apparent. Current production technologies primary use a single wafer that is processed chemically to produce finished devices. While this is adequate for many devices, it results in mechanical regions that exist primarily in the plane and do not have fully spatial mechanisms with significant depth of stacked parts. Also, the chemical processes are also not always compatible with materials that would be desirable to use with a mechanical device.

Additionally, there are numerous sources for positioning errors in mircroassembly design and manufacturing, where parts often need to be placed within micron and even submicron tolerances. For example, electrostatic forces can cause a micro part to "stick" to a gripping mechanism during release, thus affecting the final positioning. Much of the current microassembly technology lacks the capability to manipulate micro parts in a dexterous manner required for such high precision placement. Microassembly technologies currently employed rely on a variety of techniques including microgrippers, multi-finger grasps, and electrostatic/magnetic forces. Such technologies, however, are limited with respect to part manipulation dexterity, accuracy, robustness, and part variability, among others.

It is, therefore, apparent that a need exists for a system and method that provides high dexterity in manipulation of objects in microassembly design and fabrication, while allowing for accuracy, robustness, and part variability.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved system and method of microassembly using multiple probes.

It is, therefore, another aspect of the disclosed embodiments to provide for a multi-probe system and method for microassembly using multiple microscope cameras configured to provide three workspaces.

The aforementioned aspects and other objectives and advantages can now be achieved as described herein. A method and system for microassembly using multiple probes is disclosed herein. A microassembly system includes multiple manipulation actuators for holding probes and an assembly substrate. The system also includes multiple microscope cameras configured to provide three distinct workspace configurations. At the center of the manipulation actuators is a die stage which supports the assembly substrate on which parts are assembled. The system can also include a glue dispenser to provide glue to a part prior to placement.

Assembly of a MEMS from multiple parts begins with the part lying flat on the assembly substrate centered in the workspace. Two probes can then be used to press against parallel sides of the part until the probes deform. Once the part has been grasped by generating pressure against the part's edges, it is relocated to a third workspace. A third probe is used as a fixture with the two active probes used to press against the part to generate rotation. Once the part has been oriented, the die stage is adjusted so that a slot is directly underneath and aligned with the part. Glue may then be placed on the part prior to placement within the slot. The part is then placed into the slot and released.

A number of embodiments, preferred and alternative, are disclosed herein. For example, in one embodiment, a system for microassembly utilizing multiple probes can be implemented. Such a system can include, for example, a plurality of manipulation actuators for holding a plurality of probes and a die stage wherein the die stage is located between the probes, a plurality of microscope cameras positioned around the die stage to create three workspaces, an assembly substrate located on the die stage, and a glue dispenser.

In another embodiment, a glue dispenser can be provided for placing glue onto a part prior to placement within a slot. In still another embodiment, the plurality of probes is supported by a plurality of nanopositioners configured to provide six degrees of spatial motion. In another embodiment, the plurality of probes may be mounted on stages having three degrees of freedom. In still another embodiment, the plurality of nanopositioners comprises a plurality of stepper motors and piezo actuators. In yet another embodiment, the plurality of probes comprises two active probes and a positioning probe. In still another embodiment, the positioning probe is actuated in one direction. In yet another embodiment, the die stage has three or four degrees of freedom. In another embodiment, the die stage is a three degree of freedom prismatic stage.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete and will fully convey the scope of the invention to those skilled in the art. Unnecessary detail of known functions and operations may be omitted from the current description so as not to obscure the present invention. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
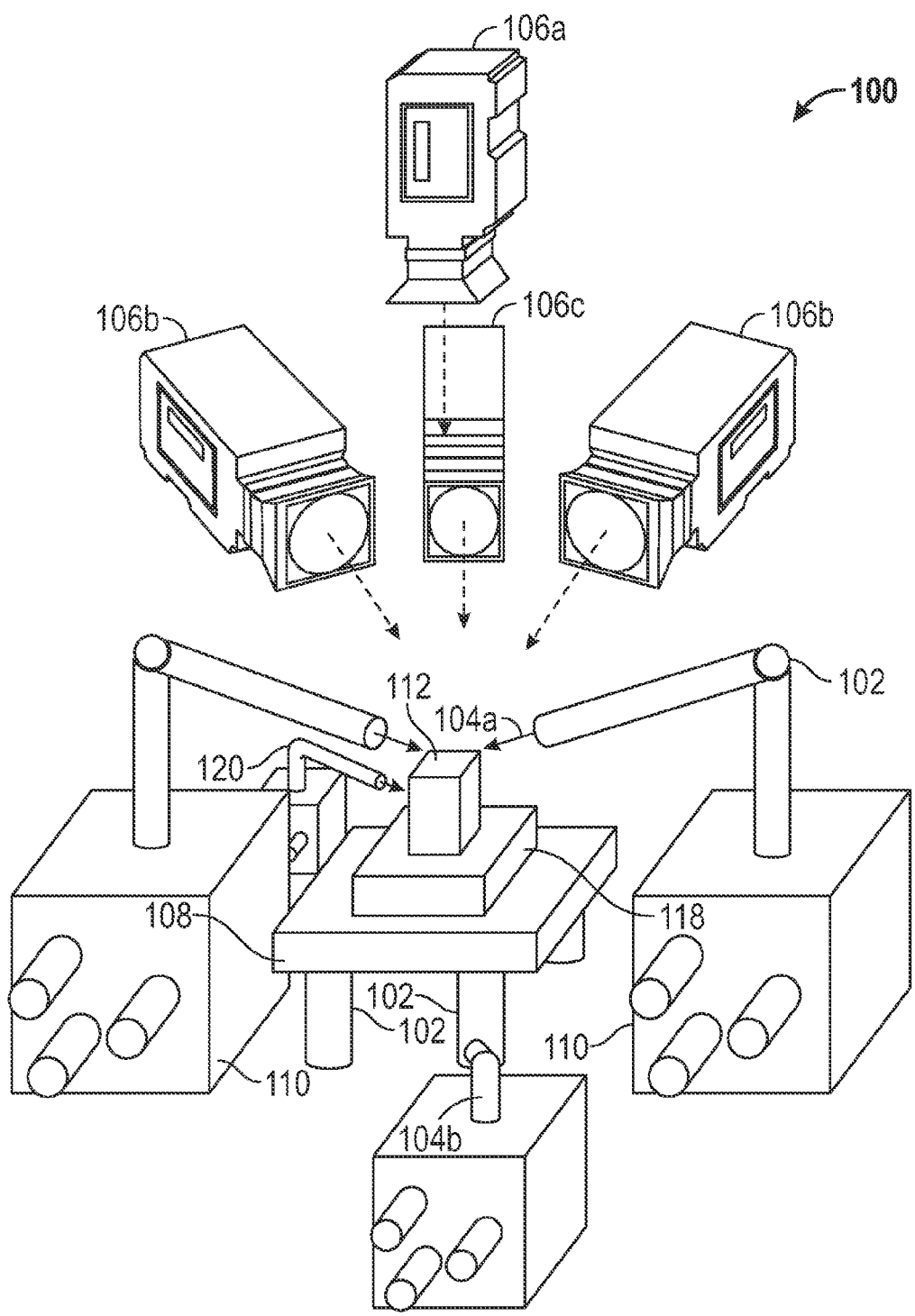
FIG. 1 illustrates a microassembly system for assembling MEMS devices from multiple pads, in accordance with the disclosed embodiments.

FIG. 1 illustrates a microassembly system 100 for assembling MEMS devices from multiple parts. The system includes multiple manipulation actuators 102 for holding probes 104 and a die stage 108. The system also includes multiple microscope cameras 106 configured to provide feedback for motion of the probes 104 and spatial orientation of a part 112 being manipulated by the system 100. At the center of the manipulation actuators 102 is a die stage 108 which supports the assembly substrate 118 on which parts 112 are assembled. In one embodiment the die stage 108 may be a three or four degrees of freedom stage. In an alternate embodiment, the die stage 108 may be a three degree of freedom (X-Y-Z planes) stage with a rotational stage located atop of a prismatic stage to allow the assembly substrate 118 to spin parallel to the X-Y plane while keeping the assembly substrate 118 flat. The system can also include a glue dispenser 120 on a three degree of freedom prismatic positioner to provide glue to a part 112 or the slot prior to placement. Glue may be dispensed from the glue dispenser 120 by way of a micropipette or other dispensing means.

As shown in FIG. 1, active probes 104a-b are located on the left and right sides of the die stage 108 and supported by nanopositioners 110 which provide six degree of freedom spatial motion. The active probes 104a-b may also be supported by stages providing three degrees of freedom. These nanopositioners 110 have multiple stepper motors (internal, not shown) and piezo actuators (internal, not shown) each to provide coarse and fine motion of the active probes 104a. A positioning probe 104b that may only be actuated in one direction can be arranged between the active probes 104a to provide a fixture for the active probes 104a to press against a part 112 during the assembly process. This actuation is used to move the positioning probe 104b into and out of a workspace. In addition, a computer control provides process control, executes feedback loops, generates commands to send to the actuators, controls the cameras, extracts information from the computer vision, and provides a manual user interface.

Figure 2:
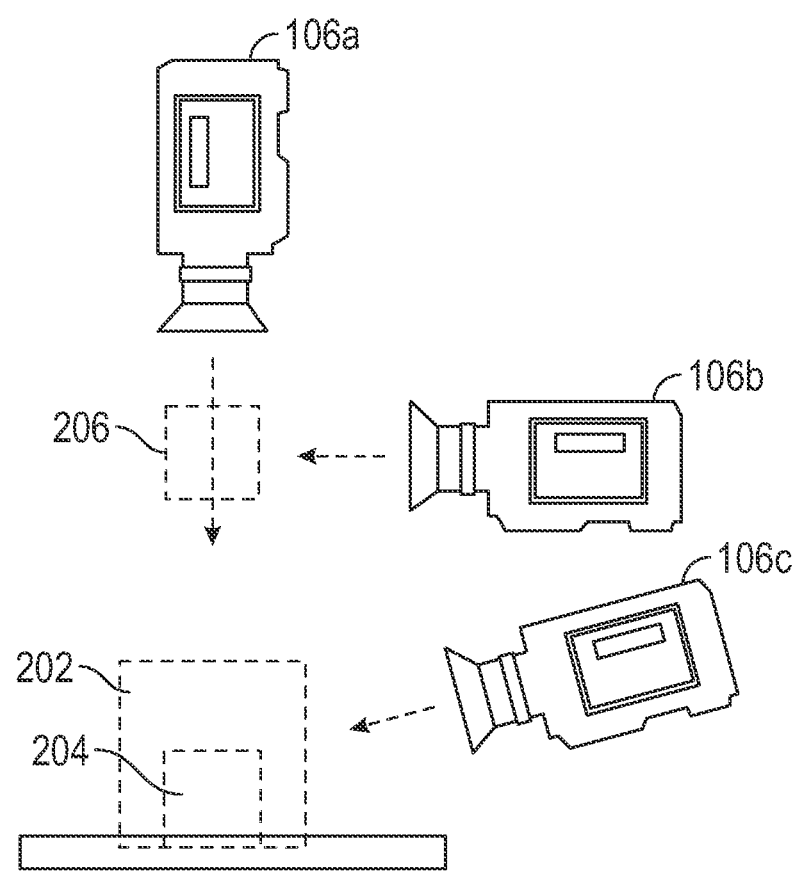
FIG. 2 illustrates configuration of the microscope cameras to allow for three distinct workspaces within the system, in accordance with the disclosed embodiments.

FIG. 2 illustrates configuration of the microscope cameras 106a-c to allow for three distinct workspaces within the system 100. The microscope cameras 106a-c can be configured to have automatic zoom and focus as required. The first workspace 202 configuration utilizes a top camera 106a and front camera 106c to provide a wide area 3D view of the workspace. The top camera 106a and front camera 106c may be set to approximately 2× zoom for this configuration. This configuration is primarily used during system calibration and gross moves of the part or substrate. It may also be used to center the part 112 in the workspace when the part 112 is sitting on the assembly substrate 118. A second 204 workspace configuration utilizes the top camera 106a and front camera 106c at 4-5× zoom to see a small area in higher resolution. This second workspace 204 is used to grasp a part 112 off the assembly substrate 118 or to insert it into a slot. A third workspace 206 configuration provides a high zoom object configuration, which is used to precisely align the part 112 in three dimensions. This configuration focuses on an area centered under the top camera 106a but located several hundred micrometers above the assembly substrate 118. In this configuration, the top camera 106e can be set to 4× zoom and two static orientation control cameras 106b are used. The two orientation cameras 106b are located so that all three cameras 106a-c in use are orthogonal. This provides maximal sensitivity of orientation in all directions. The positioning probe 104b is also configured to exist in this third workspace 206 so that all probes 104a-b are available for orientation control.

Figure 3:
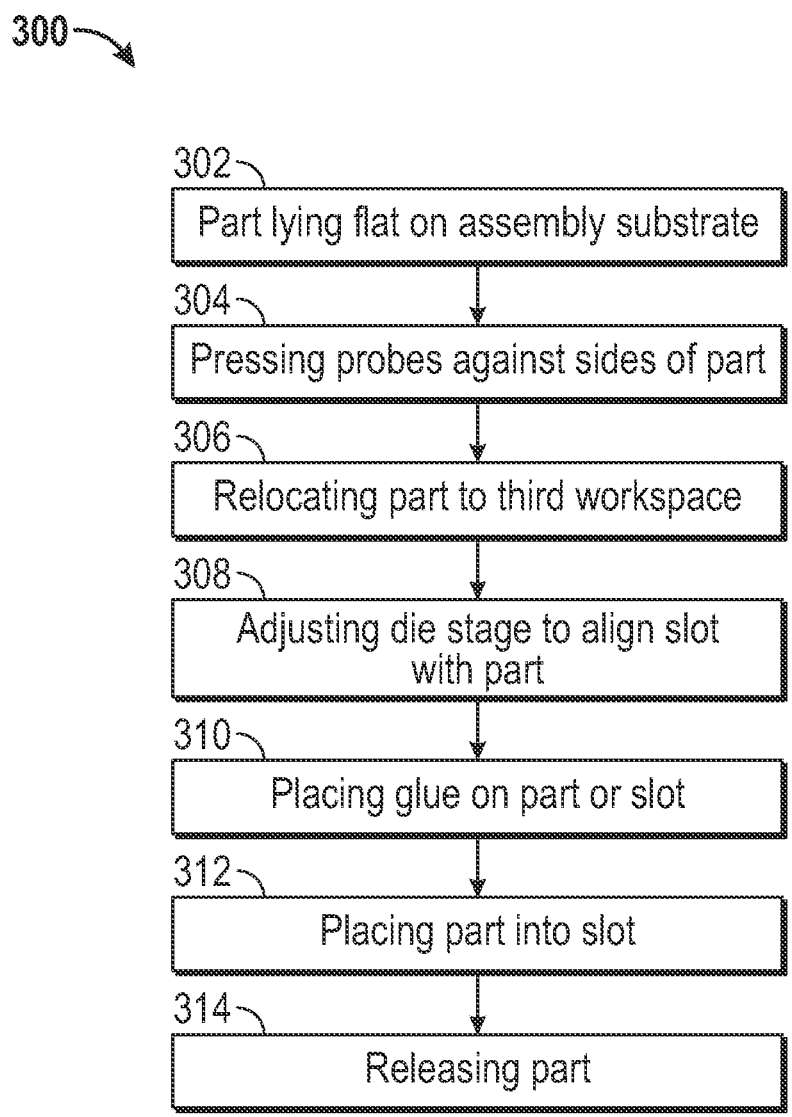
FIG. 3 illustrates a high-level flow chart indicating operational steps of a method of microassembly using the system, in accordance with the disclosed embodiments.

A high-level flow chart indicating operational steps of a method 300 of microassembly using the system 100 is illustrated in FIG. 3. The assembly sequence begins with the part 112 lying flat on the assembly substrate 118 centered in the workspace, as described in block 302. The active probes 104a can then be used to press against parallel sides of the part 112 until the probes 104a deform, as shown in block 304. In one embodiment, the active probes 104a can be applied at a thirty degree angle from horizontal and have a five to fifteen degree rotation about the Z axis. The active probes 104a can bend in two directions, but do not allow for significant deformation along the axis of the probe due to the probe's relatively long length compared to the diameter. As shown in block 306, once the part has been grasped by generating pressure against the part's edges, it is relocated to the third workspace 206. The active two probes 104a are capable of manipulating the part in five degrees of freedom, but they are not capable of rotating the part about the line of contact formed by the two probes 104a outside of a few degrees due to the design of the nanopositioners 110. The part 112 will not spin by itself because of the friction between the part 112 and probes 104a. The positioning probe 104b is used as a fixture for the active probes 104a to press against the part 112 to generate rotation of the part 112.

Once the part 112 has been oriented, the die stage 108 is adjusted so that a slot is directly underneath and aligned with the part, as described in block 308. The slot may be located in the assembly substrate 118 itself or in a part 112 and may be marked with gold or other marker to facilitate alignment. Glue may then be placed on the part 112 or slot utilizing the glue dispenser 120 prior to placement of the part 112 within the slot, as shown in block 310. The part 112 is then placed into the slot, as shown in block 312. Upon placement of the part 112 into a slot, the part 112 is released using high acceleration, as described in block 314. A benefit of using multiple probes is that it is possible to quickly and easily break the adhesion between probes and part to ensure accurate placement of the part.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A system for rnicroassembly of microelectromechanical systems comprising:
    a die stage and a plurality of manipulation actuators for holding a plurality of probes, wherein said die stage is located between at least two probes among said plurality of probes;
    a top camera directly above said die stage, and a front camera and a plurality of orientation cameras a plurality of microscope cameras positioned around said die stage, to create three workspaces,
    wherein a first and second workspace are created utilizing said top camera and said front camera and a third workspace is created utilizing said top camera and said plurality of orientation cameras; and
    an assembly substrate located on said die stage.

2. The system of claim 1 further comprising a glue dispenser.

3. The system of claim 1 wherein said plurality of probes comprises a plurality of active probes and at least one positioning probe.

4. The system of claim 3 wherein said plurality of active probes is supported by a plurality of nanopositioners configured to provide six degrees of spatial motion.

5. The system of claim 4 wherein said plurality of nanopositioners comprises a plurality of stepper motors and piezo actuators.

6. The system of claim 4 wherein said at least one positioning probe is actuated in one direction.

7. The system of claim 1 wherein said die stage is a two degree of freedom stage.

8. The system of claim 1 wherein said die stage is a three degree of freedom prismatic stage.

9. An apparatus for rnicroassembly of microelectromechanical systems comprising:
    a die stage and a plurality of manipulation actuators for holding a plurality of active probes and at least one positioning probe, wherein said die stage is centered between said plurality of active probes and said at least one positioning probe;
    a top camera directly above said die stage, and a front camera and a plurality of orientation cameras a plurality of microscope cameras positioned around said die stage, to create three workspaces,
    wherein a first and second workspace are created utilizing said top camera and said front camera and a third workspace is created utilizing said top camera and said plurality of orientation cameras; and
    an assembly substrate located on said die stage.

10. The apparatus of claim 9 further comprising a glue dispenser.

11. The apparatus of claim 9 wherein said plurality of active probes is supported by a plurality of nanopositioners configured to provide six degrees of spatial motion.

12. The apparatus of claim 11 wherein said plurality of nanopositioners comprises a plurality of stepper motors and piezo actuators.

13. The apparatus of claim 9 wherein said at least one positioning probe is actuated in one direction.

14. The apparatus of claim 9 wherein said die stage is a two degree of freedom stage.

15. The apparatus of claim 9 wherein said die stage is a three degree of freedom prismatic stage.

* * * * *